(12) United States Patent
Fukushima

(10) Patent No.: US 7,302,163 B2
(45) Date of Patent: Nov. 27, 2007

(54) INFORMATION PROCESSING APPARATUS AND RECORDING CONTROL METHOD INCLUDING ERRONEOUS-ERASURE PREVENTION FEATURE

(75) Inventor: Nobuo Fukushima, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 1098 days.

(21) Appl. No.: 10/280,006

(22) Filed: Oct. 25, 2002

(65) Prior Publication Data

US 2003/0090946 A1     May 15, 2003

(30) Foreign Application Priority Data

Nov. 15, 2001   (JP) ............................. 2001-350327

(51) Int. Cl.
H04N 5/91     (2006.01)
H04N 5/225    (2006.01)
H04N 5/76     (2006.01)
H04N 5/00     (2006.01)
H04N 9/79     (2006.01)
H04N 7/00     (2006.01)

(52) U.S. Cl. .................. 386/94; 348/207.2; 348/231.1; 386/125; 386/126; 386/45; 386/46

(58) Field of Classification Search ............... 386/1, 386/45, 46, 94, 125–126; 360/60; 348/231.3, 348/207.2

See application file for complete search history.

(56) References Cited

U.S. PATENT DOCUMENTS

| | | | | |
|---|---|---|---|---|
| 4,618,060 A | * | 10/1986 | Tarter ........................ | 360/133 |
| 4,803,351 A | * | 2/1989 | Shigenaga .................. | 235/492 |
| 4,816,937 A |   | 3/1989 | Fukushima ............... | 360/73.03 |
| 4,860,142 A | * | 8/1989 | DiGiesi ..................... | 360/133 |
| 5,051,849 A |   | 9/1991 | Fukushima et al. ........... | 360/59 |
| 5,150,219 A |   | 9/1992 | Fukushima ................. | 358/335 |
| 5,218,452 A |   | 6/1993 | Kondo et al. ............... | 358/342 |
| 5,317,404 A |   | 5/1994 | Fukushima et al. ......... | 358/335 |
| 5,359,422 A |   | 10/1994 | Fukushima ................. | 358/296 |
| 5,416,560 A | * | 5/1995 | Taka .......................... | 396/287 |
| 5,459,508 A |   | 10/1995 | Fukushima ................. | 348/243 |
| 5,778,265 A | * | 7/1998 | Seki ........................... | 396/311 |
| 5,805,300 A |   | 9/1998 | Fukushima ................. | 358/404 |
| 5,903,700 A |   | 5/1999 | Fukushima ................. | 386/46 |
| 6,141,036 A |   | 10/2000 | Katayama et al. ............ | 348/47 |
| 6,198,526 B1 | * | 3/2001 | Ohtsuka ...................... | 355/40 |
| 6,573,927 B2 | * | 6/2003 | Parulski et al. ............... | 348/32 |
| 6,684,310 B2 | * | 1/2004 | Anzai et al. ................. | 711/164 |
| 6,760,128 B2 | * | 7/2004 | Jackson et al. ............. | 358/453 |
| 6,850,273 B1 | * | 2/2005 | Yoshida et al. .......... | 348/231.3 |

(Continued)

Primary Examiner—Thai Q. Tran
Assistant Examiner—Daquan Zhao
(74) Attorney, Agent, or Firm—Fitzpatrick, Cella, Harper & Scinto

(57) ABSTRACT

An information processing apparatus for receiving a recording medium that stores image data and data setting conditions for an operation relating to the image data, and that includes an erroneous-erasure prevention mechanism, includes an image recording device for rewriting or erasing image data recorded in the recording medium, a setting device for setting conditions for an operation relating to the image data recorded in the recording medium, a detector for detecting a state of the erroneous-erasure prevention mechanism, and a controller for performing control of the apparatus so that, when the detector detects that the erroneous-erasure prevention mechanism is in an erroneous-erasure prevention state, an operation of the image recording device is prohibited, and an operation of the setting device is permitted.

8 Claims, 6 Drawing Sheets

U.S. PATENT DOCUMENTS

2003/0067701 A1*  4/2003  Christie, Jr. ................. 360/60
2005/0033914 A1*  2/2005  Matsunami et al. ........ 711/114
2005/0051636 A1*  3/2005  Okaue et al. ............... 235/492

* cited by examiner

INFORMATION PROCESSING APPARATUS AND RECORDING CONTROL METHOD INCLUDING ERRONEOUS-ERASURE PREVENTION FEATURE

BACKGROUND OF THE INVENTION

1. Field of the Invention

The present invention relates to an information processing apparatus that accesses data stored in a recording medium that includes erroneous-erasure prevention means, and a method for controlling recording in the recording medium.

2. Description of the Related Art

Memory cards having a mechanical write-prevention mechanism, such as an erroneous-erasure prevention pawl or the like, are well known. In such a memory card, which may include a flexible disk or a cassette tape, when an erroneous-erasure prevention pawl is set at a write-prevention position, erasure of data stored in the memory card and writing of new data into the memory card are prohibited.

FIG. 6 is a perspective view illustrating a memory card 100 including an erroneous-erasure prevention pawl 102, and illustrates the memory card 100 in a state in which erroneous-erasure prevention is released. FIG. 7 illustrates the memory card 100 in a state in which erroneous erasure is prevented. When the erroneous-erasure prevention pawl 102 is slid to the position shown in FIG. 6, the erroneous-erasure prevention pawl 102 is set in an erroneous-erasure prevention release position and the memory card 100 is set in an erroneous-erasure prevention release state; when the erroneous-erasure prevention pawl 102 is slid in the direction of an arrow WP (Write Prevention) as shown in FIG. 7, the erroneous-erasure prevention pawl 102 is set in the erroneous-erasure prevention position and the memory card 100 is set in an erroneous-erasure prevention state.

If a memory card including a mechanical erroneous-erasure prevention mechanism such as the erroneous-erasure prevention pawl 102 is used in a digital camera or a digital camcorder, the following drawbacks may arise.

Initially, some digital cameras and digital camcorders for recording images in a memory card form a file for designating printing operation information for a stored image (DPOF (Digital Print Order Format)). Although a detailed description will be omitted herein, a DPOF file describes, for example, the number of prints of each image to be printed. For example, when asking a print-service shop to perform printing, the printer system reads a DPOF file within a card, and automatically prints the designated number of copies of each designated image. A personal printer can also perform similar automatic printing if it has the function of discriminating a DPOF file.

When presenting a memory card to a print-service shop, in order to prevent rewriting or erasure of images stored in the memory card, a user may set the memory card to a state for prohibiting writing, and release designation of printing operation information that has been set, after printing. For that purpose, it is necessary to temporarily release the erroneous-erasure prevention mechanism immediately before printing. However, it is problematic to release the erroneous-erasure prevention mechanism solely for the purpose of changing designation of printing operation information.

In some cases, the user inadvertently may perform an operation of writing or erasing an image as a result of forgetting that the erroneous-erasure prevention mechanism remains in the released state, and become aware of the state of prevention of erroneous erasure only after receiving an error message.

In another case, the user may forget to change the designated printing operation information after performing a printing operation, and undesirably again print an image when the user subsequently inserts the memory card into a printer the next time. This results in great waste.

In order to overcome drawbacks, a configuration has been proposed in which a release mechanism which automatically releases an erroneous-erasure prevention mechanism of a memory card is provided in a printer. However, in a printer that allows insertion of a plurality of different types of memory cards having different mechanical shapes, it is necessary to adapt such a release mechanism to a plurality of types of erroneous-erasure prevention mechanisms. Hence, this approach may be onerous or impractical.

A configuration also may be considered in which, rather than providing a mechanical erroneous-erasure prevention mechanism, a change of writing is prohibited for each file, as in a filing system of a computer. In this approach, however, it is impossible to determine whether or not rewriting or erasure of a recorded image is prohibited by observing an external appearance of the memory card. In addition, it is necessary to connect the memory card to a particular apparatus when setting it in a protection state or releasing it from such a setting. This is also problematic.

SUMMARY OF THE INVENTION

It is an object of the present invention to overcome the above-described drawbacks.

It is another object of the present invention to provide an information processing apparatus in which it is possible to change or erase control information relating to printing conditions, operation conditions and the like for a recorded image, while prohibiting a change or erasure of image data of the recorded image using an erroneous-erasure prevention mechanism, i.e., maintaining a function of protecting the recorded image, when a recording medium is set in an erroneous-erasure prevention state.

It is still another object of the present invention to provide a system of accessing a recording medium with a degree of freedom and to expand the functions of the system, by allowing a change or erasure of control information relating to a recorded image in the above-described manner.

According to one aspect, the present invention relates to an information processing apparatus for receiving a recording medium that stores image data and data setting operation conditions relating to the image data, and that includes erroneous-erasure prevention means. The information processing apparatus includes image recording means for rewriting or erasing image data stored in the recording medium, means for setting operation information relating to the image data stored in the recording medium, detection means for detecting a state of the erroneous-erasure prevention means, and control means for performing control so that, when the detection means detects that the erroneous-erasure prevention means is in an erroneous-erasure prevention state, an operation of the image recording means is prohibited, and an operation of the setting means is permitted.

According to another aspect, the present invention relates to a recording control method for controlling recording in a recording medium that stores image data and operation conditions relating to the image data, and that includes erroneous-erasure prevention means. The method includes the steps of detecting whether or not the erroneous-erasure prevention means is in an erroneous-erasure prevention state, and performing control so as to prohibit a change or erasure of stored image data and to permit a change of the operation conditions, when it is detected in the detecting step that the erroneous-erasure prevention means is in the erroneous-erasure prevention state.

The foregoing and other objects, advantages and features of the present invention will become more apparent from the following detailed description of the preferred embodiments taken in conjunction with the accompanying drawings.

DETAILED DESCRIPTION OF THE PREFERRED EMBODIMENTS

Preferred embodiments of the present invention will now be described in detail with reference to the drawings.

Figure 1:
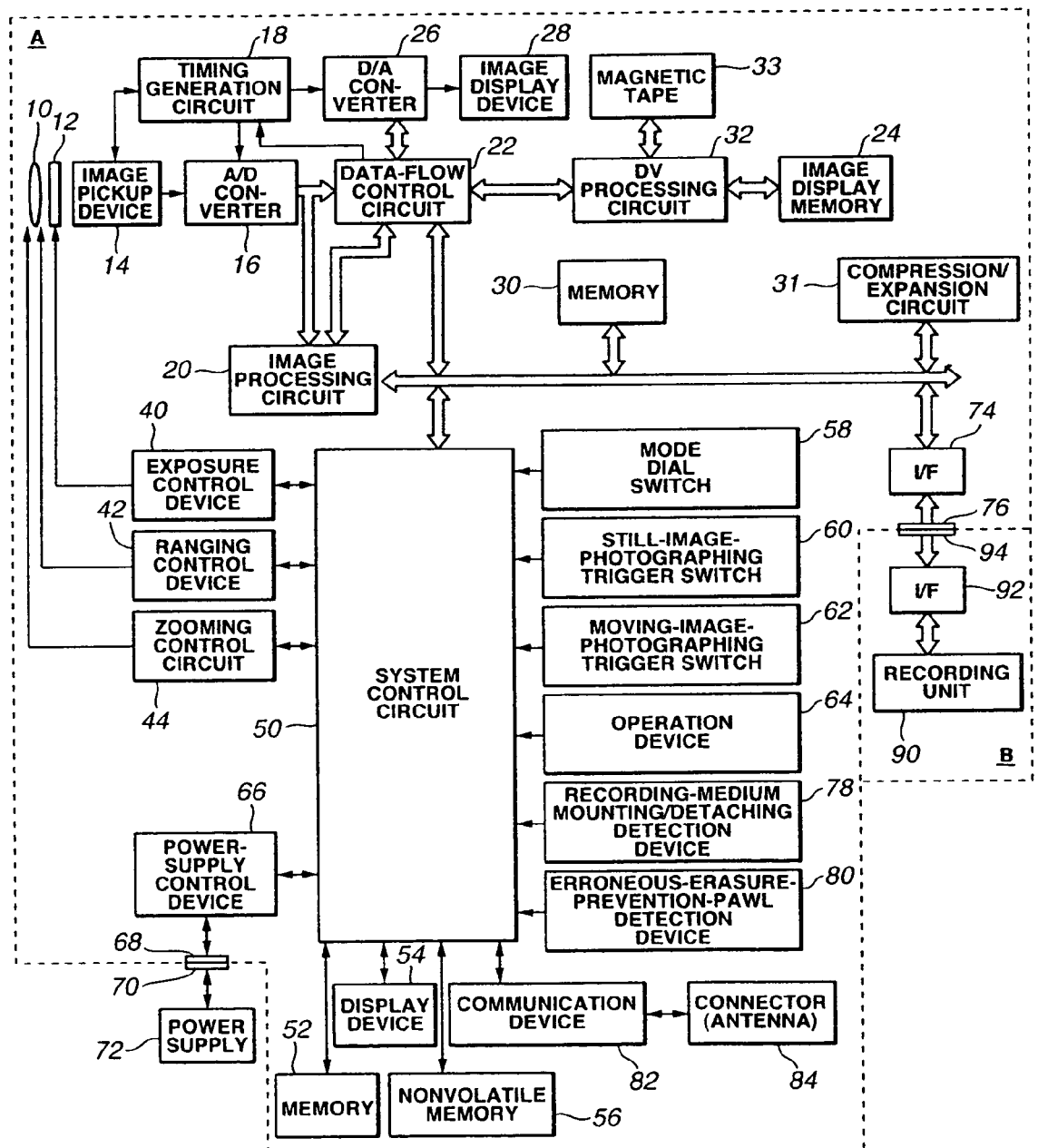
FIG. 1 is a schematic block diagram illustrating the configuration of a first embodiment of the present invention.

FIG. 1 is a schematic block diagram illustrating the configuration of a first preferred embodiment of the present invention. In FIG. 1, there are schematically shown an image processing apparatus A, and a recording medium B.

The image processing apparatus A includes a photographing lens 10, an exposure-amount control member 12 including a diaphragm, a shutter and the like, an image pickup device 14 for converting an optical image into an electric signal, an A/D (analog-to-digital) converter 16 for converting an analog signal output from the image pickup device 14 into a digital signal, and a timing generation circuit 18 for supplying the image pickup device 14, the A/D converter 16 and a D/A (digital-to-analog) converter 26 with clock signals and/or control signals. The timing generation circuit 18 is controlled by a data-flow control circuit 22 and a system control circuit 50.

An image processing circuit 20 performs predetermined pixel interpolation processing and color conversion processing for data from the A/D converter 16 and data from the data-flow control circuit 22. The image processing circuit 20 also performs calculation processing for the control of the amount of exposure and ranging control in accordance with image data output from the A/D converter 16.

The data-flow control circuit 22 controls data input/output among the A/D converter 16, the timing generation circuit 18, the image processing circuit 20, an image display memory 24, the D/A converter 26, a memory 30, a compression/expansion circuit 31, and the like. During a photographing and recording operation, output data from the A/D converter 16 is written into the image display memory 24 or the memory 30 via the image processing circuit 20 and the data-flow control circuit 22, or only via the data-flow control circuit 22.

An image display device 28 comprises a TFT (thin-film transistor)-type liquid-crystal display (LCD) panel. Image data for display written in the image display memory 24 is supplied to the image display device 28 via the D/A converter 26, and an image corresponding to the image data is displayed in the image display device 28. By successively displaying output images from the image pickup device 14, i.e., images corresponding to output image data from the A/D converter 16, on the image display device 28, the image display device 28 operates as an electronic finder.

Photographed still images or moving images are temporarily stored in the memory 30. The memory 30 has a sufficient storage capacity for temporarily storing a predetermined number of frames of still images, or moving images for a predetermined time period. The memory 30 is also used as an operational region for the system control circuit 50.

The compression/expansion circuit 31 compresses/expands image data. The compression/expansion circuit 31 reads image data or compressed image data stored in the memory 30, compresses or expands the read image data, and writes processed data into the memory 30.

A DV (digital video) processing circuit 32 records photographed images on a magnetic tape 33. For example, the DV processing circuit 32 converts image data into data conforming to a digital video format, adds predetermined information to the data, and records the resultant data on the magnetic tape 33. The magnetic tape 33 is caused to run by a tape running system (not shown), and data is recorded on and reproduced from the magnetic tape 33 using a drum head (not shown). An exposure control device 40 controls the exposure-amount control member 12. A ranging control device 42 controls a focusing operation of the photographing lens 10. A zooming control device 44 controls a zooming operation of the photographing lens 10. The exposure control device 40 and the ranging control device 42 are controlled according to a TTL (through the lens) method. That is, based on a result of calculation of photographed image data by the image processing circuit 20, the system control circuit 50 controls the amount of exposure and focusing via the exposure control device 40 and the ranging control device 42, respectively.

The system control circuit 50 controls the entirety of the image processing apparatus A. A memory 52 stores constants, variables, programs and the like for operations of the system control circuit 50. The memory 52 comprises, for example, a nonvolatile memory, such as a flash memory or the like. A display device 54 includes a liquid-crystal display device, a speaker and the like for displaying an operational state, a message or the like using characters, images and/or sound or the like. At least one display device 54 is installed at a position so as to be easily observed near an operation unit of the image processing apparatus A. The display device 54 is configured, for example, by a combination of an LCD, LED's (light-emitting diodes), a sound device, and the like.

Reference numeral 56 represents an electrically erasable/recordable nonvolatile memory for storing various adjustment values and the like. The memory 56 comprises, for example, an EEPROM (electrically erasable and programmable read-only memory).

Operation means 58, 60, 62 and 64 input various operation instructions to the system control circuit 50, and comprise switches, dials, touch panels, line-of-sight detection pointing devices, voice recognition devices, or a combination of these devices.

A mode dial switch 58 can be switched so as to set the apparatus in one of plural functional modes, such as a power-supply-off mode, a photographing recording mode, a reproducing mode, an erasure mode, and the like. There are also shown a still-image photographing trigger switch 60, and a moving-image photographing trigger switch 62.

An operation device 64 includes various buttons, touch panels and the like, such as a zooming switch, a menu button, a setting button, a menu moving + (plus) button, a menu moving − (minus) button, a reproduced-image moving + (plus) button, a reproduced-image moving − button, a photographing picture quality selection button, an exposure correction button, and the like.

A power-supply control device 66 includes a battery detection circuit, a DC-DC converter, a switch circuit for switching a block to be supplied with a current, and the like. The power-supply control device 66 detects mounting/detaching of a battery, the type of the battery, the remaining amount of the battery, and supplies each unit, inclusive of a recording medium, with a necessary voltage during a necessary time period by controlling the DC-DC converter based on the result of detection and an instruction from the system control device 50.

Connectors 68 and 70 connect a power supply 72 to the power-supply control device 66. A battery or an AC adapter may be used as the power supply 72.

Reference numeral 74 represents an interface with the recording medium B. The recording medium B is connected to a connector 76. A recording medium mounting/detaching detection device 78 detects whether or not the recording medium B is mounted. An erroneous-erasure-prevention-pawl detection device 80 detects the state of an erroneous-erasure prevention pawl of the recording medium B mounted to the connector 76.

A communication device 82 performs communication with other devices, and comprises, for example, an RS232C, USB or IEEE 1394 device, radio communication, or the like. A connector (an antenna in the case of radio communication) 84 connects the image processing apparatus A to another apparatus via the communication device 82.

The recording medium B includes a recording unit 90 comprising a semiconductor memory, a magnetic disk or the like, an interface 92 with the image processing apparatus A, and a connector 94 capable of being connected to the connector 76.

Operations of the first embodiment will now be described. FIGS. 2-5 are flowcharts illustrating the operations of the first embodiment.

First, an outline of an operation of photographing a still image as a camera will be described. First, it is determined to which position among plural positions, e.g., for power-supply-off mode, recording mode, reproducing mode and erasure mode, the mode dial 60 is set (steps S1, S3 and S4).

When the mode dial 60 is set at the position of turning off the power supply (step S1), a sequence to disconnect the power supply is executed (step S2). That is, processing being executed is appropriately interrupted, and power supply to each unit is disconnected.

When the mode dial 60 is set at the position of the recording mode (step S3), a recording mode sequence is executed (steps starting from step 7).

When the mode dial 60 is set at the position of the reproducing mode as a result of the determination in step S4, a reproducing mode sequence is executed (step S5). In the reproducing mode sequence, a moving image or a still image is displayed on the picture surface of the display device 28 by reproducing information from a tape or a card.

When the mode dial 60 is set at the position of the erasure mode as a result of the determination in step S4, an erasure mode sequence is executed (step S6).

In the recording mode sequence, first, adjustment of the amount of exposure and a focusing control operation for the image pickup device 10 are performed (step S7). Then, display means, such as a liquid-crystal view finder or the like, is performed (step S8). Thus, a photographed image is displayed on the finder. Then, it is determined whether or not the current state is a state in which recording can be erased, by checking the state of the medium and referring to the result of the detection of the erroneous-erasure-prevention-pawl detection device 80 (step S9).

If the result of the determination in step S9 is affirmative, the process proceeds to step S10, where it is determined whether or not the still-image trigger switch 60 is switched on. If the result of the determination in step S10 is affirmative, the photographed image is recorded in the recording medium B (step S11). If the result of the determination in step S10 is negative, the process proceeds to step S12, where it is determined whether or not the moving-image recording trigger switch 62 is switched on. If the result of the determination in step S12 is affirmative, the process proceeds to step S13, where an operation of recording moving images on the tape is performed, and the process then returns to step S1. Thereafter, recording of moving images on the tape is continued until the moving-image recording trigger switch 62 is switched off as a result of the determination in step S12, or the power supply is turned off as a result of the determination in step S1. When the moving-image recording trigger switch 62 is switched off as a result of the determination in step S12, recording of moving images on the tape is interrupted (step S14), and then the process returns to step S1.

Figure 3:
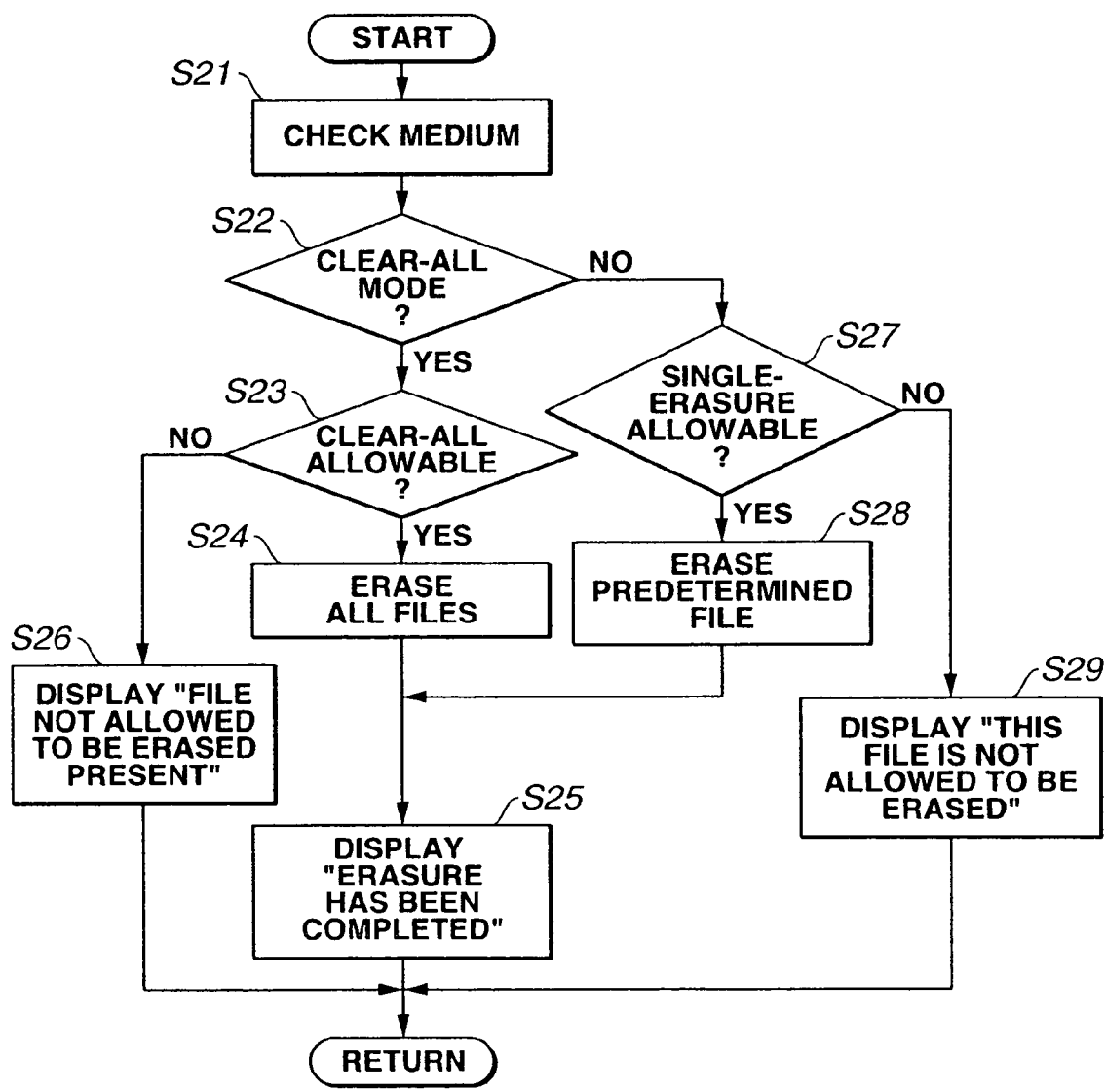
FIG. 3 is a flowchart illustrating the details of an erasure operation (step S6 shown in FIG. 2)

FIG. 3 is a flowchart illustrating the details of the erasure operation (step S6).

First, the recording medium B is checked (step S21). In this check of the recording medium B, when it has been determined that erasure of the entire card is prohibited (by detecting mounting), that erasure of the entire card is prohibited (by detection of an internal flag), or that erasure of all files within the card is prohibited (based on file management information), the process returns to step S1. In other cases, the succeeding step S22 is executed. That is, when erasure of at least part of the files is permitted, processing starting from step S22 is executed.

In step S22, it is determined whether the erasure mode of the main body is a clear-all mode in which the entirety of a plurality of files within the card is erased, or a single erasure mode in which a designated specific file is erased.

In the case of the clear-all mode (step S22), if a file set to prohibition of erasure is absent within the card as the result of a check of the medium in step S21, as a result of the determination in step S23 all files are erased (step S24), and a message indicating completion of erasure is displayed on the display device 28 (step S25). If at least one file set to prohibition of erasure is present within the card as a result of the determination in step S23, this fact is displayed on the display device 28 (step S26).

In the case of the single erasure mode as a result of the determination in step S22, it is determined whether or not erasure of a designated specific file is permitted, as the result of a check of the medium in step S21 (step S27). If the result of the determination in step S27 is affirmative, the specific file is erased (step S28), and a message indicating completion of erasure is displayed on the display device 28 (step S25). If the result of the determination in step S27 is negative, the fact that the assigned file cannot be erased is displayed on the display device 28 (step S29).

Figure 6:
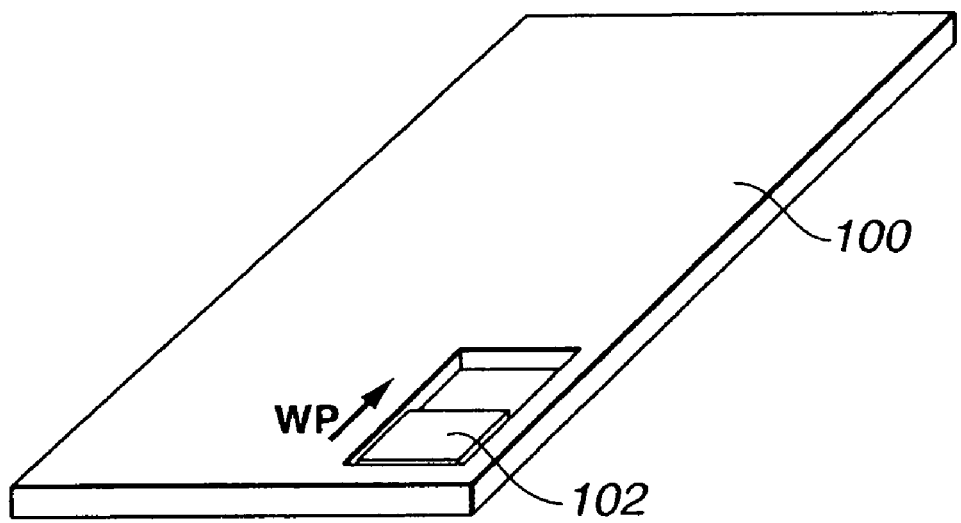
FIG. 6 is a perspective view illustrating a state in which prevention of erroneous erasure is released in a memory card including an erroneous-erasure prevention pawl.
Figure 7:
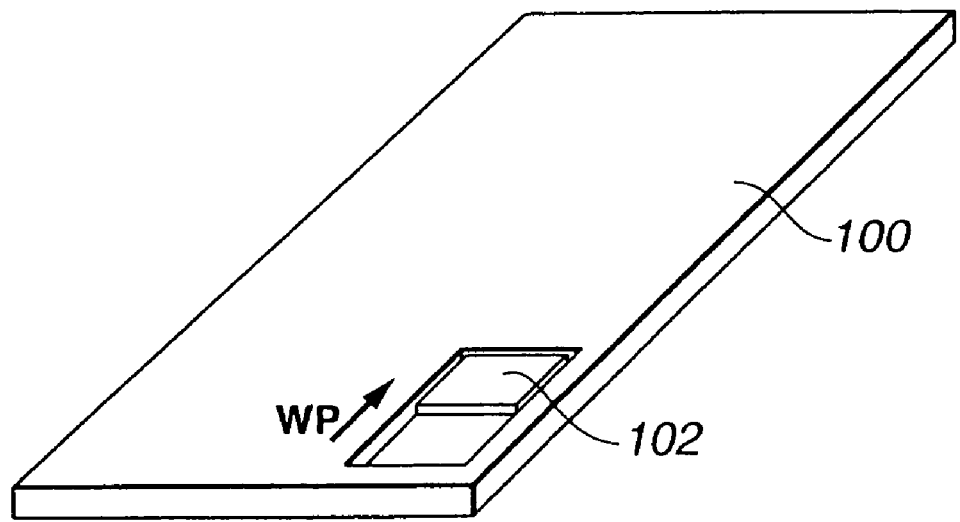
FIG. 7 is a perspective view illustrating a state in which erroneous erasure is prevented in the memory card including the erroneous-erasure prevention pawl.

As for the erroneous-erasure prevention pawl mechanism, in addition to the sliding-pawl type shown in FIGS. 6 and 7 used, for example, as an erroneous-erasure prevention pawl mechanism of a 3.5-inch flexible disk, a breakable pawl type used, for example, in a VHS (trade name) video cassette tape, a stretchable tape type, and the like may also be adopted. That is, a mechanism having a function equivalent to the function of the erroneous-erasure prevention pawl that can be externally observed on a medium may be used. When intending to prohibit writing or erasure, the user operates a pawl or a slide switch for preventing erroneous erasure on a card so as to be situated at a predetermined position.

In the first embodiment, prevention of erroneous erasure indicates not only prohibition of erasure, but also prohibition of additional writing and overwrite.

Figure 2:
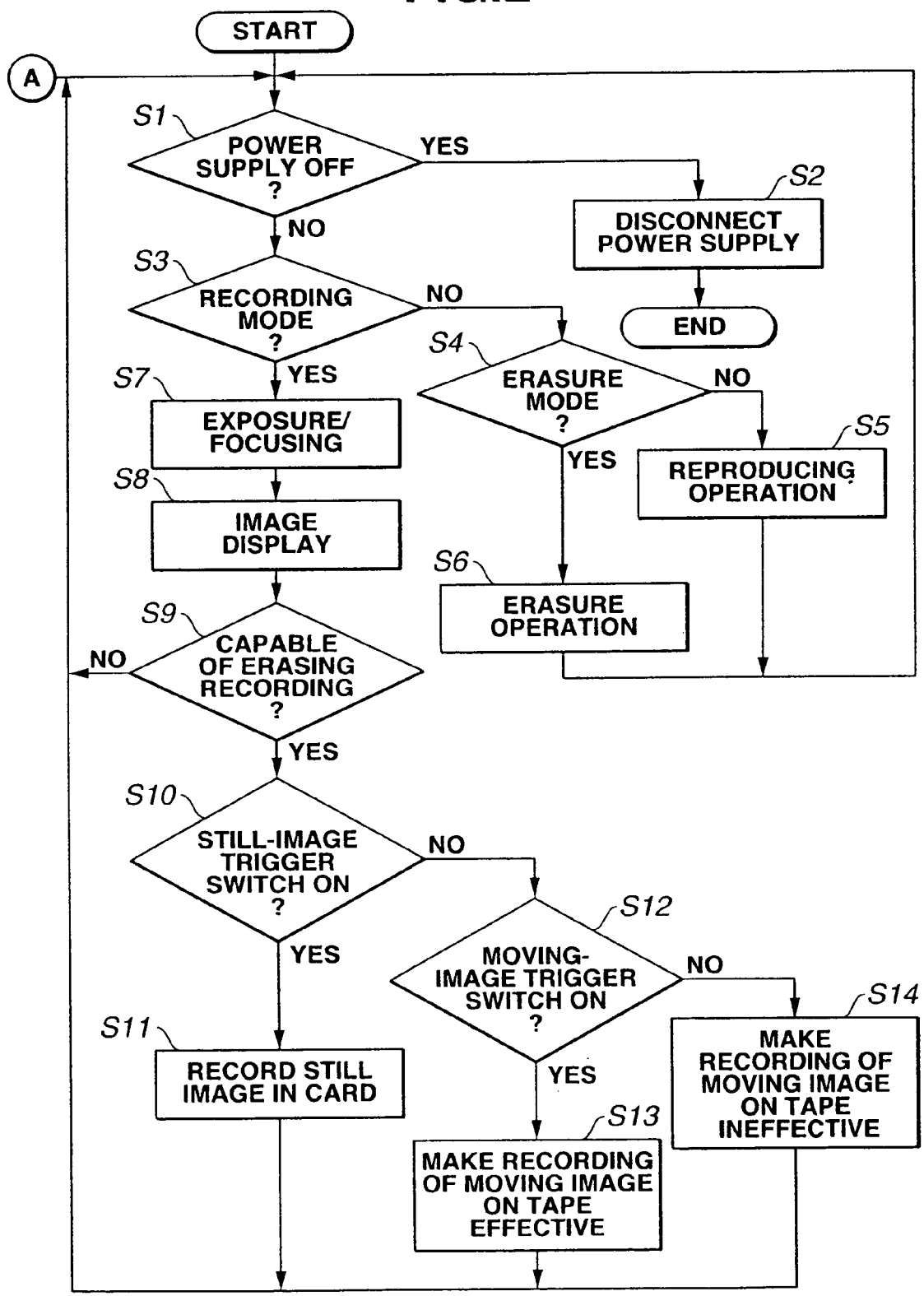
FIG. 2 is a flowchart illustrating operations of the first embodiment.
Figure 4:
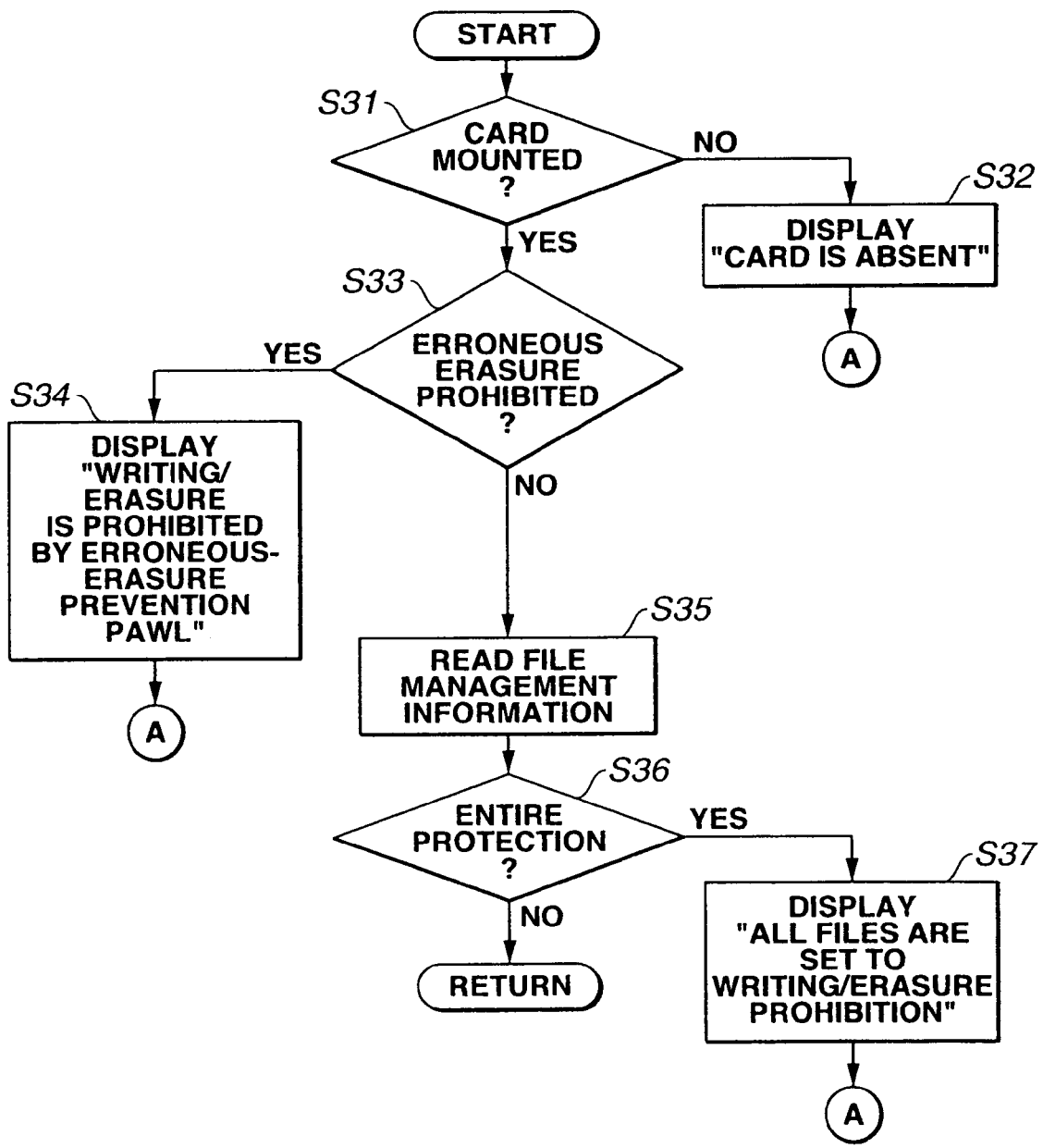
FIG. 4 is a flowchart illustrating the details of a method of checking a state of a recording medium (step S7 shown in FIG. 2 and step S21 shown in FIG. 3)

FIG. 4 is a flowchart illustrating the details of the check of the medium (step S9 shown in FIG. 2 and step S21 shown in FIG. 3). First, it is determined whether or not the card (the recording medium B) is mounted in the main body of the image processing apparatus A (step S31). In the case of a card in which part of each of the connection terminals of the card and the main body is provided as a dedicated CD (card detect) terminal, the state of the CD terminal may be detected via a port (for example, the recording medium mounting/detaching detection device 78) of a CPU (central processing unit) or the like of the main body. Usually, the CD terminal is grounded at the card side. The CD terminal port of the CPU of the main body assumes a high (H) level when the card is not mounted. Accordingly, when the card is mounted, the CD terminal of the CPU of the main body side becomes a low (L) level. Thus, mounting of the card can be detected. In the case of a card not having a CD terminal, communication with the card may be tried at an appropriate time interval, and mounting of the card may be determined if communication can be correctly performed.

If the result of the determination in step S31 is negative, the process proceeds to step S32, where a message indicating that the card is not mounted, for example, "The card is absent.", is displayed on the display device 28, and the process then returns to step S1.

If the result of the determination in step S31 is affirmative, the process proceeds to step S33, where it is determined whether or not the erroneous-erasure detection pawl of the card is at an erroneous-erasure prevention position.

If the result of the determination in step S33 is affirmative, the process proceeds to step S34, where a message indicating the fact, for example, "Writing/erasure is prohibited in this card by the erroneous-erasure prevention pawl.", is displayed on the display device 28, and the process then returns to step S1.

If the result of the determination in step S33 is negative, the process proceeds to step S35, where file management information written in the card is checked. The file management information includes information relating to prohibition of writing in the entirety of a plurality of files, and information relating to prohibition of writing for each file, when the plurality of files are recorded in the card.

In step S36, it is determined whether or not writing in all files is prohibited. If the result of the determination in step S36 is affirmative, the process proceeds to step S37, where a message indicating the fact, for example, "All files within this card are set to prohibition of writing/erasure.", is displayed on the display device 28, and the process then returns to step S1.

If the result of the determination in step S36 is negative, the check of the medium is terminated.

Figure 5:
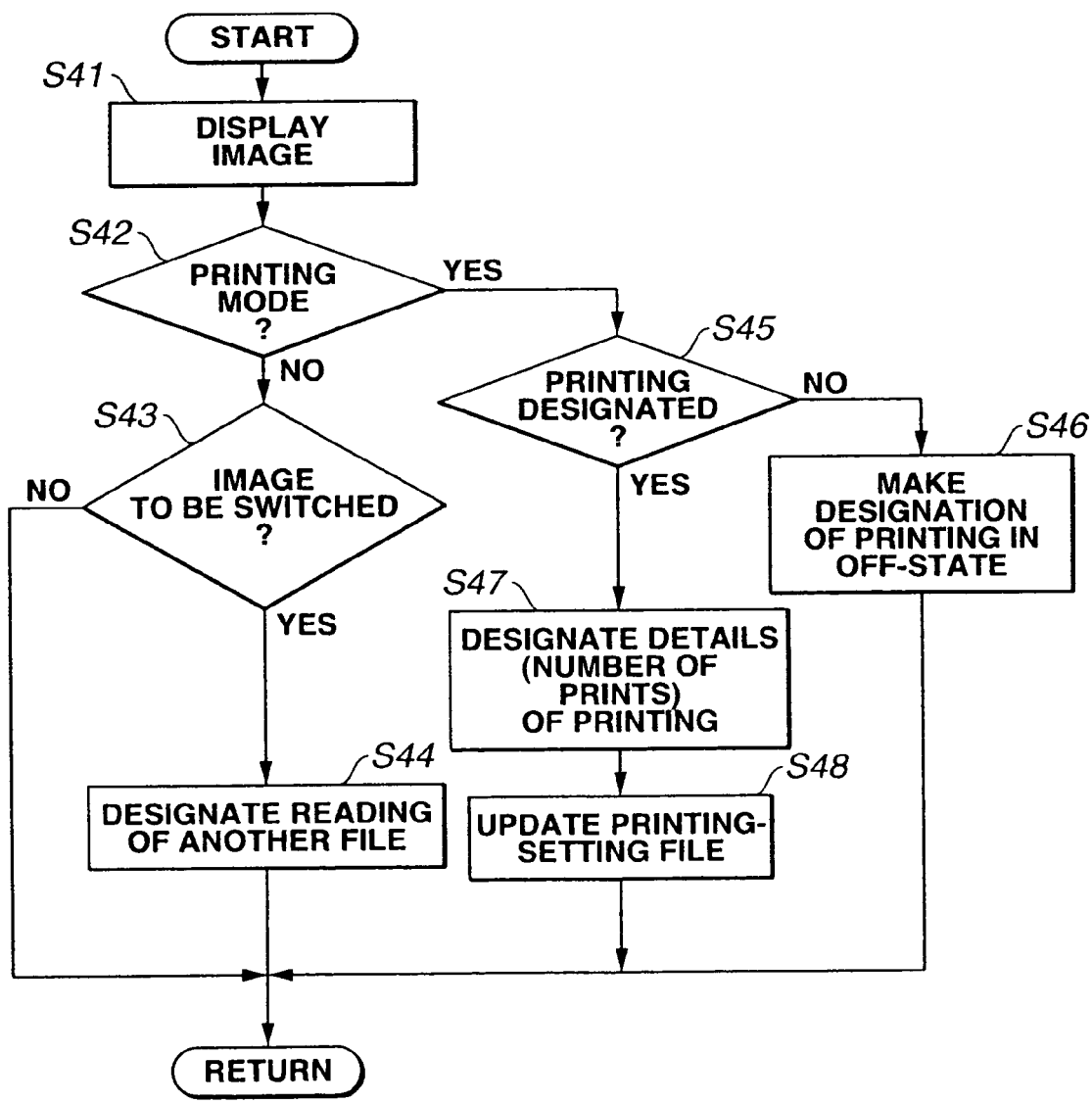
FIG. 5 is a flowchart illustrating a reproducing mode and a printing designation operation (step S5 shown in FIG. 2)

Next, a description will be provided of the reproducing mode and an operation of designating printing operation information in step S5 shown in FIG. 2. FIG. 5 is a flowchart illustrating this operation.

First, a predetermined image file is read from a memory medium, compressed image data is expanded, and the resultant reproduced image is displayed on the display device 28 (step S41). In step S42, it is determined whether or not the current mode is a printing mode. The printing mode is set through the operation device 64, or the like. If the result of the determination in step S42 is negative, an operation is performed in an ordinary reproducing mode. That is, it is determined whether or not the currently reproduced image is to be updated (step S43). If the result of the determination in step S43 is negative, the process returns. If the result of the determination in step S43 is affirmative, the process proceeds to step S44, where the succeeding image file is designated printing information, and then the process returns. When updating an image, an image file is actually read when executing the process of step S41. For that purpose, in step S44, updating of the succeeding image file to be read is temporarily stored within the control unit. Actually, in step S44, a pointer indicating a file name or a file is updated.

If the result of the determination in step S42 is affirmative, for example, a menu picture frame including a picture frame for setting printing operation conditions is displayed on image display device 28 or display device 54 based on an operation through the operation device 64, or the like, and the user inputs printing conditions on the menu picture frame. More specifically, such an operation is realized in an interactive form in which questions to the user are displayed via an ordinary user interface, and the user is asked to select one of a plurality of options.

First, it is determined whether or not the currently displayed image is to be printed, based on an instruction from the operator (step S45). If the result of the determination in step S45 is negative, designation of printing operation conditions is made in an off-state (step S46), and then the process returns. If the result of the determination in step S45 is affirmative, detailed information relating to the number of prints, and the like is set (step S47), the printing-setting file is updated (step S48), and then the process returns.

As described above, in a series of reproducing and printing condition designating operations, the state of erroneous-erasure prevention of the memory card is not detected. In a reproducing operation, usually, the state of erroneous-erasure detection of the memory card is not detected. Hence, the first embodiment is the same as the conventional approach. However, in the printing mode of the first embodiment, although the printing-conditions file is updated (step S48), the state of erroneous-erasure prevention is not detected. That is, printing operation conditions information can be changed irrespective of the state of erroneous-erasure prevention.

In the foregoing description, image files are protected by an erroneous-erasure prevention mechanism, and information other than image information is not necessarily protected. However, in a system in which voice can also be recorded, voice files may also be protected by an erroneous-erasure prevention mechanism.

Although in the first embodiment, the state of erroneous-erasure prevention is not detected in the printing mode, the state of erroneous-erasure prevention may also be detected in the printing mode. In this case, when the operator intends to change designation of printing conditions irrespective of the state of erroneous-erasure prevention, it is preferable to notify the operator of a message indicating this state. For example, contents such as "May printing information be changed although the card is in the state of erroneous-erasure prevention?" are displayed or output in recorded voice. It is thereby possible to confirm the operator's intention, and prevent an erroneous operation.

In the first embodiment, information relating to setting of printing operation conditions information can be changed irrespective of the state of erroneous-erasure prevention. However, in some cases, it is desired to prohibit any change in the state of erroneous-erasure prevention depending on the situation, as in the conventional approach. In consideration of such a case, whether or not printing operation conditions information is to be changed may be selected irrespective of the state of an erroneous-erasure prevention mechanism, and information relating to setting of permission to update printing operation conditions information may be written in a management region of a memory within the card. The system first reads the information relating to permission to update printing operation conditions information. Then, the system changes the printing operation conditions information irrespective of the state of the erroneous-erasure prevention mechanism if updating is permitted, as in the first embodiment, and prohibits a change of the printing operation conditions information in the state of erroneous-erasure prevention if the updating is prohibited, as in the conventional approach. This setting of permission to update printing operation conditions information is performed from the main body or a computer when the state is not in the state of erroneous-erasure prevention.

Although in the first embodiment, a system for recording or reproducing images, such as a digital camera, is assumed, the present invention may also be applied to a printing apparatus. That is, in a system having a printing function, designation of printing operation conditions may be changed when terminating printing. In this case, the printing apparatus may change information relating to designation of printing operation conditions every time an image has been printed. Particularly, when rewriting printing operation conditions information in the state of erroneous-erasure prevention, an erroneous operation can be easily prevented by displaying a message or sounding an alarm to notify the operator of this state.

In the foregoing embodiments, it is possible to set whether or not a file other than an image file is to be protected by a mechanical erroneous-erasure prevention mechanism. In professional printing services, it is expected that insertion/extraction of a card and accompanying setting/releasing of a state of an erroneous-erasure prevention switch are frequently performed. In such cases, the above-described embodiments are convenient because designation of printing operation conditions can be changed irrespective of the state of the erroneous-erasure prevention switch. When it is difficult to know that part of the contents of a card is not protected and, as a result, an erroneous operation is expected, such as in a use by an ordinary user, it is also possible to prohibit any change by a mechanical erroneous-erasure prevention mechanism, as in the conventional approach. Thus, it is possible to provide an optimum system in accordance with the situation or the operator, in the same apparatus.

Since information relating to designation of printing operation conditions is updated in accordance with the actual situation of printing, it is possible to reduce the frequency of a failure, such as wasteful printing or the like, and to simplify operation.

As can be easily understood from the foregoing description, according to the present invention, it is possible to rewrite information other than an image while protecting image data, and realize both reliability and convenience. Furthermore, as for image information, it is possible to externally know whether or not an image is protected, compared with designation of the attribute of a file, and easily set protection of an image. As a result, it is possible to prevent waste, such as erroneous printing of a plurality of copies of the same image.

The individual components shown in outline or designated by blocks in the drawings are all well known in the information processing apparatus and recording control method arts and their specific construction and operation are not critical to the operation or the best mode for carrying out the invention.

While the present invention has been described with respect to what are presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A recording medium accessing apparatus for accessing a recording medium that stores image data and print setting data related to the image data, the recording medium accessing apparatus comprising:

accessing means for accessing the image data and the print setting data of the recording medium;

erroneous-erasure prevention detecting means for detecting whether or not the recording medium is set to an erroneous-erasure prevention state; and access control means for controlling said accessing means so that, when said erroneous-erasure prevention detecting means detects that the recording medium is in the erroneous-erasure prevention state, a rewriting and erasing of the image data stored in the recording medium are prohibited, wherein said accessing means reads change permissibility information, indicating whether or not to permit rewriting of the print setting data, wherein, when the change permissibility information permits rewriting of the print setting data, said access control means controls said accessing means to rewrite the print setting data, regardless of whether or not the recording medium is in the erroneous-erasure prevention state, and wherein, when the change permissibility information indicates that rewriting of the print setting data is forbidden and said erroneous-erasure prevention detecting means detects that the recording medium is in the erroneous-erasure prevention state, said access control means controls said accessing means so that a rewriting of the print setting data is prohibited.

2. The recording medium accessing apparatus according to claim 1, further comprising warning means for performing warning before said accessing means rewrites the print setting data when said erroneous-erasure prevention detecting means detects that the recording medium is in the erroneous-erasure-prevention state.

3. The recording medium accessing apparatus according to claim 1, wherein the print setting data includes information for designating whether or not a corresponding image is to be printed or a number of times the image is to be printed, for each image corresponding to the image data recorded in the recording medium.

4. The recording medium accessing apparatus according to claim 1, wherein the print setting data are described in the form of a DPOF (Digital Print Order Format) file.

5. A recording medium accessing method for accessing a recording medium that stores image data and print setting data related to the image data, the recording medium accessing method comprising:

an accessing step of accessing the image data and the print setting data of the recording medium;

an erroneous-erasure prevention detecting step of detecting whether or not the recording medium is set to an erroneous-erasure prevention state; and an access control step of controlling said accessing step so that, when said erroneous-erasure prevention detecting step detects that the recording medium is in the erroneous-erasure prevention state, a rewriting and erasing of the image data stored in the recording medium are prohibited, wherein said accessing step reads change permissibility information, indicating whether or not to permit rewriting of the print setting data, wherein, when the change permissibility information permits rewriting of the print setting data, said access control step controls said accessing step to rewrite the print setting data, regardless of whether or not the recording medium is in the erroneous-erasure prevention state, and wherein, when the change permissibility information indicates that rewriting of the print setting data is forbidden and said erroneous-erasure prevention detecting step detects that the recording medium is in the erroneous-erasure prevention state, said access control step controls said accessing step so that a rewriting of the print setting data is prohibited.

6. The recording medium accessing method according to claim 5, further comprising a warning step of performing warning before said accessing step rewrites the print setting data when said erroneous-erasure prevention detecting step detects that the recording medium is in the erroneous-erasure-prevention state.

7. The recording medium accessing method according to claim 5, wherein the print setting data includes information for designating whether or not a corresponding image is to be printed or a number of times the image is to be printed, for each image corresponding to the image data recorded in the recording medium.

8. The recording medium accessing method according to claim 5, wherein the print setting data are described in the form of a DPOF (Digital Print Order Format) file.

* * * * *

UNITED STATES PATENT AND TRADEMARK OFFICE
CERTIFICATE OF CORRECTION

PATENT NO. : 7,302,163 B2
APPLICATION NO. : 10/280006
DATED : November 27, 2007
INVENTOR(S) : Nobuo Fukushima It is certified that error appears in the above-identified patent and that said Letters Patent is hereby corrected as shown below:

COLUMN 2:
Line 1, "become" should read --becomes--.

COLUMN 6:
Line 10, "view finder" should read --viewfinder--.

COLUMN 11:
Line 2, "erasure-prevention" should read --erasure prevention--.

COLUMN 12:
Line 19, "erasure-prevention" should read --erasure prevention--.

Signed and Sealed this

Tenth Day of February, 2009

JOHN DOLL
*Acting Director of the United States Patent and Trademark Office*